(12) United States Patent
Yokoyama et al.

(10) Patent No.: US 9,165,957 B2
(45) Date of Patent: Oct. 20, 2015

(54) DETECTING DEVICE, DETECTING SYSTEM, AND MANUFACTURING METHOD OF DETECTING DEVICE

(71) Applicant: CANON KABUSHIKI KAISHA, Tokyo (JP)

(72) Inventors: Keigo Yokoyama, Honjo (JP); Minoru Watanabe, Honjo (JP); Masato Ofuji, Takasaki (JP); Jun Kawanabe, Kumagaya (JP); Kentaro Fujiyoshi, Tokyo (JP); Hiroshi Wayama, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/276,762

(22) Filed: May 13, 2014

(65) Prior Publication Data

US 2014/0339561 A1 Nov. 20, 2014

(30) Foreign Application Priority Data

May 15, 2013 (JP) .................................. 2013-103324
May 15, 2013 (JP) .................................. 2013-103326

(51) Int. Cl.
*H01L 31/00* (2006.01)
*H01L 27/146* (2006.01)
*H01L 31/0224* (2006.01)
*H01L 31/105* (2006.01)
*H01L 31/115* (2006.01)

(52) U.S. Cl.
CPC ........ *H01L 27/146* (2013.01); *H01L 27/14603* (2013.01); *H01L 27/14663* (2013.01); *H01L 27/14692* (2013.01); *H01L 31/022408* (2013.01); *H01L 31/1055* (2013.01); *H01L 31/115* (2013.01); *Y02E 10/50* (2013.01)

(58) Field of Classification Search
None
See application file for complete search history.

(56) References Cited

FOREIGN PATENT DOCUMENTS

JP 2002-026300 A 1/2002

*Primary Examiner* — Yasser A Abdelaziez
(74) *Attorney, Agent, or Firm* — Canon USA, Inc. IP Division

(57) ABSTRACT

A detecting device includes a conversion device having a substrate, a pixel electrode formed of a transparent conductive oxide, a impurity semiconductor portion, and a semiconductor portion, the pixel electrode, impurity semiconductor portion, and semiconductor portion having been formed upon the substrate in that order from the substrate side. The impurity semiconductor portion includes a first region including a place in contact with the pixel electrode, and a second region situated nearer to the semiconductor portion than the first region. Concentration of dopant in the second region is higher than concentration of dopant in the first region.

16 Claims, 17 Drawing Sheets

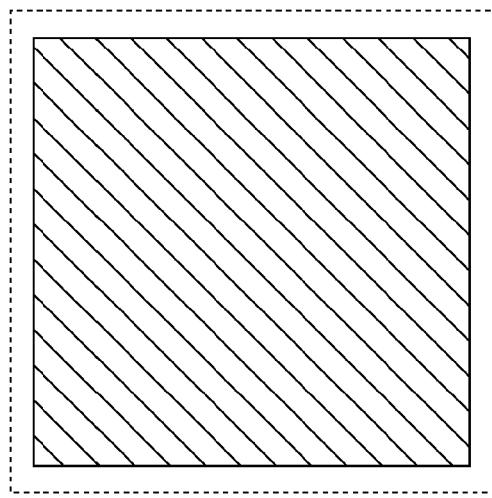
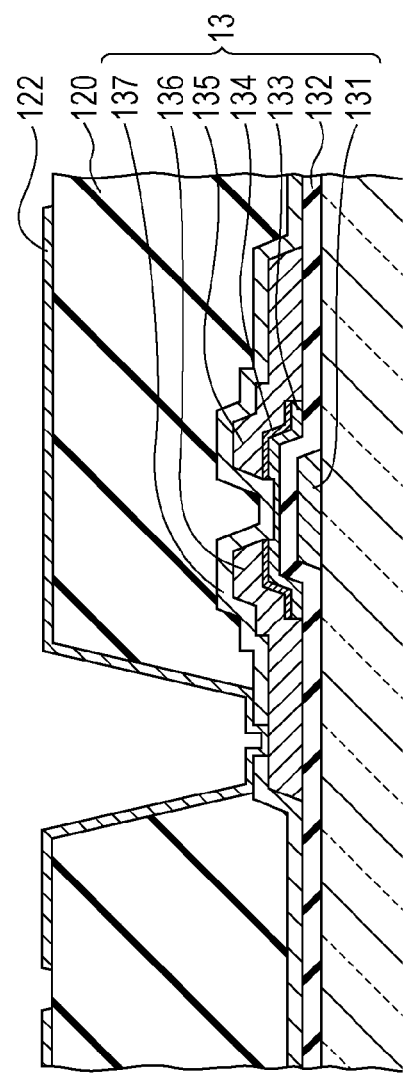
FIG. 3A
FIG. 3B

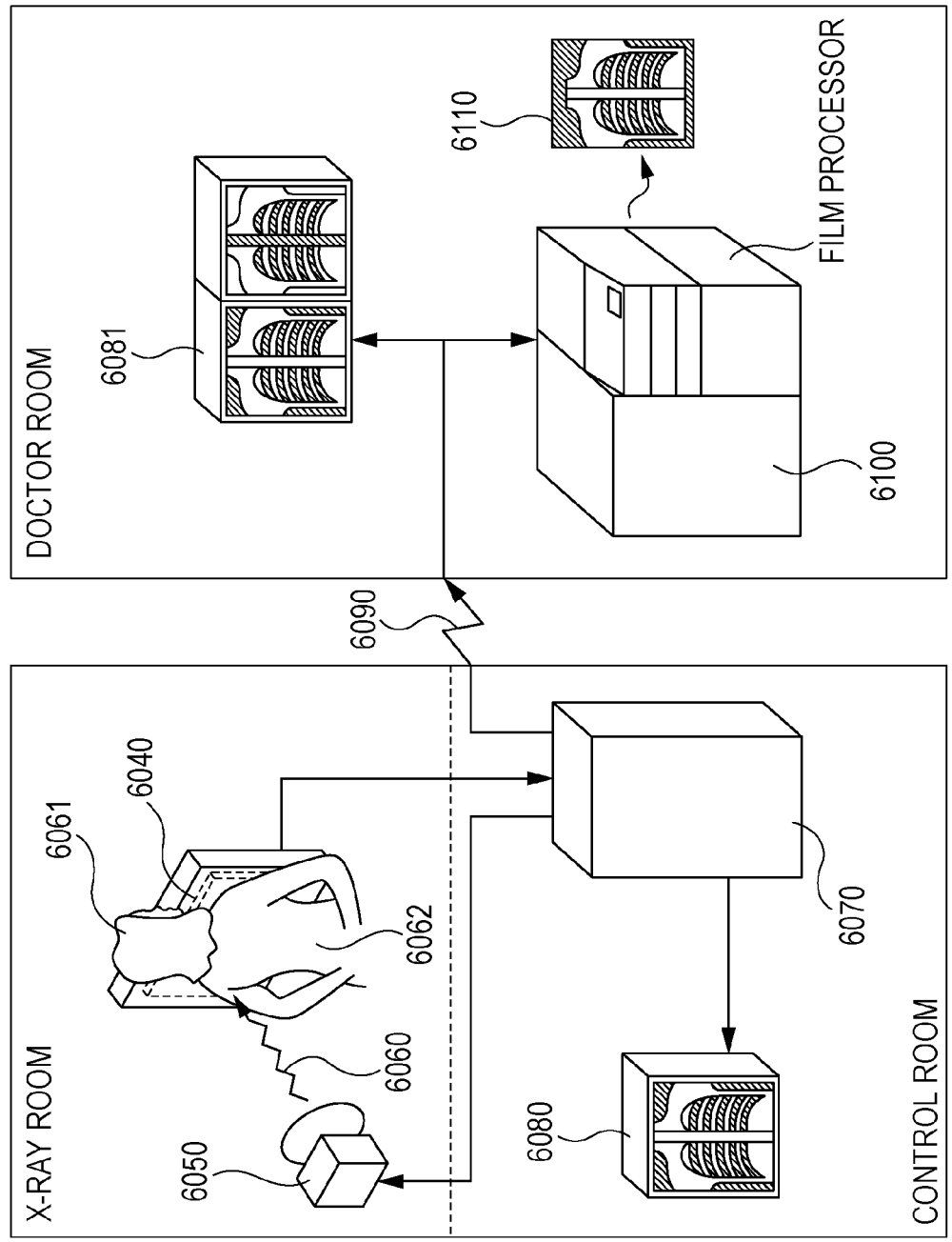

DETECTING DEVICE, DETECTING SYSTEM, AND MANUFACTURING METHOD OF DETECTING DEVICE

BACKGROUND OF THE INVENTION

1. Field of the Invention

One disclosed aspect of the embodiments relates to a detecting device, detecting system, and manufacturing method of the detecting device, that are applied to a medical diagnostic imaging apparatus, a non-destructing inspection apparatus, an analysis apparatus using radiation, and so forth.

2. Description of the Related Art

As of recent, thin-film semiconductor manufacturing technology is also being applied to detecting devices having an array of pixels (pixel array), combining switching devices such as thin-film transistors (TFT) and conversion devices which convert radiation or light into charge such as photodiodes or the like. Japanese Patent Laid-Open No. 2002-026300 discloses, as a detecting device according to the related art, a switching device disposed on a substrate, a conversion device disposed on the switching device and electrically connected to the switching device, and an inter-layer insulating layer disposed between the substrate, switching device, and conversion device. The conversion device described in Japanese Patent Laid-Open No. 2002-026300 includes a pixel electrode electrically connected to the switching device, a counter electrode disposed facing the pixel electrode, a semiconductor portion disposed between the pixel electrode and counter electrode, and an impurity semiconductor portion disposed between the pixel electrode and the semiconductor portion. A polycrystalline transparent conductive oxide is used for this pixel electrode, for efficient illumination if light to reduce afterimage. Further, Japanese Patent Laid-Open No. 2002-026300 discloses that a buffer layer may be provided to the conversion device to improve adhesion between the semiconductor portion and the pixel electrode.

However, the configuration in Japanese Patent Laid-Open No. 2002-026300 has had difficulty in realizing both the adhesion of the impurity semiconductor portion and transparent conductive oxide, and dark current properties of the conversion device. Improving the adhesion of the impurity semiconductor portion and transparent conductive oxide has led to lowered dark current properties of the conversion device, and improved dark current properties of the conversion device has led to deterioration in adhesion of the impurity semiconductor portion and transparent conductive oxide.

SUMMARY OF THE INVENTION

A detecting device according to an aspect of the embodiments includes a detecting device including a substrate, a pixel electrode formed of a transparent conductive oxide, an impurity semiconductor portion, and a semiconductor portion. The pixel electrode, impurity semiconductor portion, and semiconductor portion are formed upon the substrate in that order from the substrate side. The impurity semiconductor portion includes a first region including a place in contact with the pixel electrode, and a second region situated nearer to the semiconductor portion than the first region. A concentration of a dopant in the second region is higher than a concentration of a dopant in the first region.

A detecting device according to another aspect of the embodiments includes a detecting device including a substrate, a pixel electrode formed of a transparent conductive oxide, an impurity semiconductor portion, and a semiconductor portion. The pixel electrode, impurity semiconductor portion, and semiconductor portion are formed upon the substrate in that order from the substrate side. The impurity semiconductor portion includes a first impurity semiconductor layer including a place in contact with the pixel electrode, and a second impurity semiconductor layer situated nearer to the semiconductor portion than the first impurity semiconductor layer. A concentration of a dopant in the second impurity semiconductor layer is higher than a concentration of a dopant in the first impurity semiconductor layer.

A detecting system according to another aspect of the embodiments includes the above-described detecting device, a radiation source configured to emit radiation toward the detecting device, a signal processing unit configured to process signals from the detecting device, a recording unit configured to record signals from the signal processing unit, a display unit configured to display signals from the signal processing unit; and a transmission processing unit configured to transmit signals from the signal processing unit.

A manufacturing method of a detecting device including a detecting device having a substrate, a pixel electrode, a impurity semiconductor portion, and a semiconductor portion, the pixel electrode, impurity semiconductor portion, and semiconductor portion having been formed upon the substrate in that order from the substrate side, includes forming a impurity semiconductor film serving as the impurity semiconductor portion such that a first region of the impurity semiconductor film, including a place in contact with a transparent conductive oxide serving as the pixel electrode, has concentration of a dopant lower than concentration of a dopant in a second region of the impurity semiconductor layer formed after the first region.

A manufacturing method of a detecting device including a detecting device having a substrate, a pixel electrode, a impurity semiconductor portion, and a semiconductor portion, the pixel electrode, impurity semiconductor portion, and semiconductor portion having been formed upon the substrate in that order from the substrate side, includes forming, on a first impurity semiconductor film formed in contact with a transparent conductive oxide serving as the pixel electrode, a second impurity semiconductor film having the same polarity as the first impurity semiconductor film, thereby forming a impurity semiconductor film which covers the transparent conductive oxide and serves as the impurity semiconductor portion. A concentration of a dopant of the first impurity semiconductor film is lower than the concentration of the second impurity semiconductor film.

Further features of the disclosure will become apparent from the following description of exemplary embodiments with reference to the attached drawings.

BRIEF DESCRIPTION OF THE DRAWINGS

FIGS. 3A and 3C are cross-sectional schematic views illustrating a manufacturing method of the detecting device according to the first embodiment, and FIGS. 3B and 3D are mask patterns for illustrating the manufacturing method of the detecting device according to the first embodiment.

FIG. 11 is a conceptual diagram of a radiation detecting system using the detecting device according to one embodiment.

DESCRIPTION OF THE EMBODIMENTS

Embodiments of the disclosure will be described in detail with reference to the attached drawings. Note that in the Present Specification, the term "radiation" includes, in addition to α rays, β rays, γ rays, and so forth, which are beams formed of particles (including photons) discharged by radioactive decay, beams or equivalent or greater energy, examples of which include X-rays, particle beams, cosmic rays, and so forth.

First Embodiment

Figure 1A:
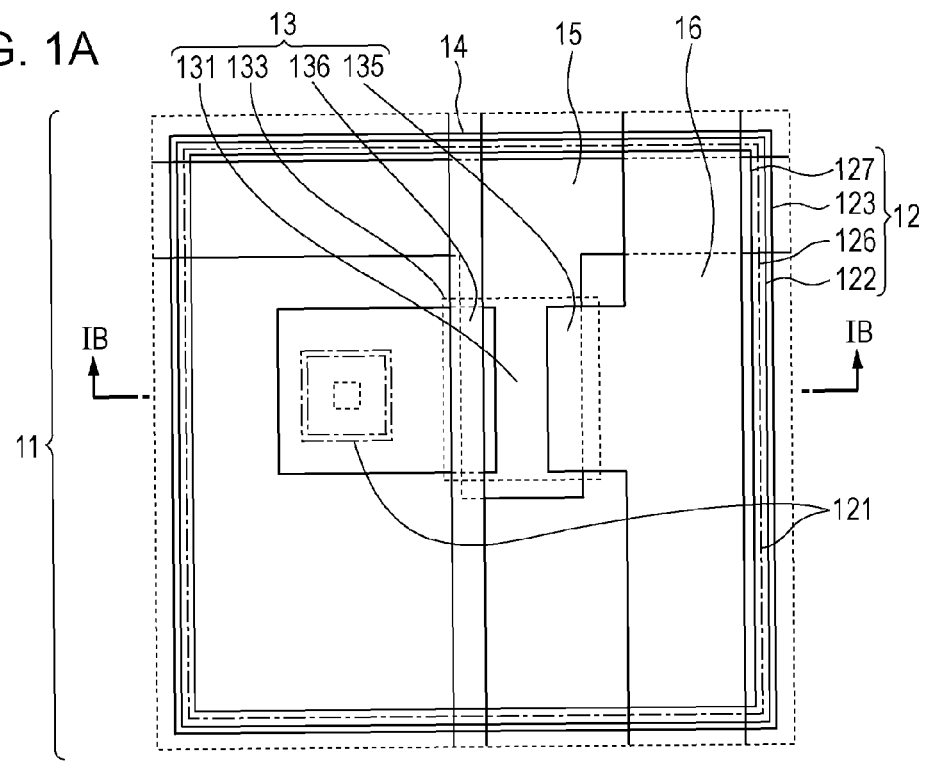
FIG. 1A is a plan schematic view for one pixel in a detecting device according to a first embodiment.
Figure 1B:
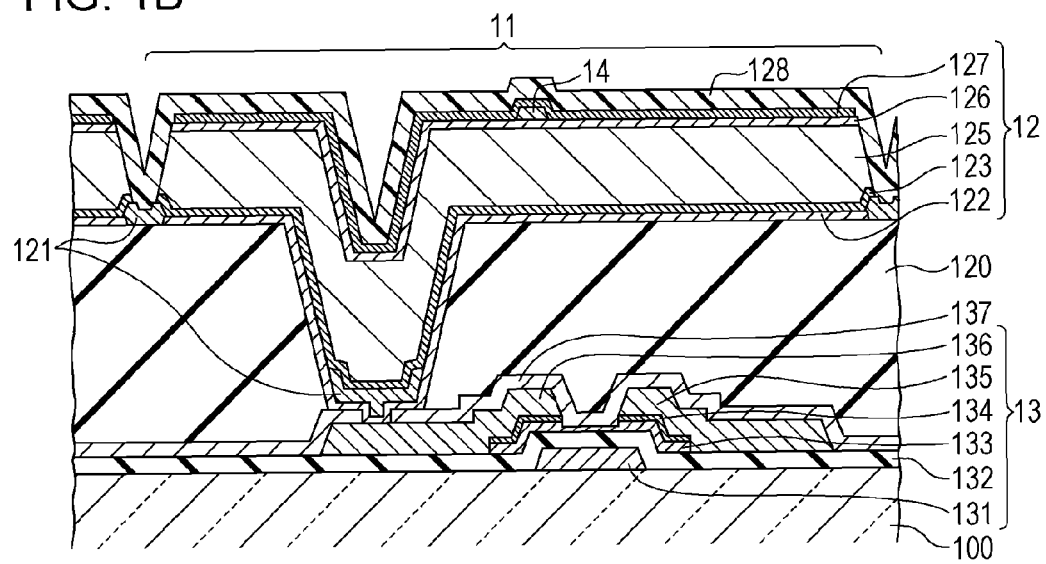
FIG. 1B is a cross-sectional schematic view for one pixel in the detecting device according to the first embodiment.

First, a detecting device according to a first embodiment will be described with reference to FIGS. 1A and 1B. FIG. 1A is a plan schematic view for one pixel making up the detecting device, and FIG. 1B is a cross-sectional schematic view taken along line IB-IB in FIG. 1A. Only the pixel electrode is illustrated for the conversion device in FIG. 1A, for sake of brevity.

Multiple pixels 11 are arrayed on a substrate 100 in the detecting device according to one embodiment. Each individual pixel 11 includes a conversion device 12 which converts radiation or light into electric charge, and a TFT 13 which is a switching device that outputs electric signals corresponding to the charge of the conversion device 12, as illustrated in FIGS. 1A and 1B. A p-type/intrinsic/n-type (PIN) photodiode formed of amorphous silicon is used as the conversion device 12 in the present embodiment. The conversion device 12 is formed on a TFT 13 provided on the substrate 100 which is an insulating glass substrate or the like, stacked with an inter-layer insulating layer 120 formed of an organic material having been introduced therebetween. The inter-layer insulating layer 120 is disposed so as to cover the multiple TFTs 13, which are the multiple switching devices, as illustrated in FIG. 1B. The surface of the inter-layer insulating layer 120 is covered by a covering member 121 formed of an inorganic material, and a pixel electrode 122.

The TFT 13 includes, disposed on the substrate 100 in order from the substrate side, a control electrode 131, an insulating layer 132, a semiconductor layer 133, a impurity semiconductor layer 134 which has a higher concentration of a dopant than the semiconductor layer 133, a first main electrode 135, and a second main electrode 136. The impurity semiconductor layer 134 comes into contact with the first main electrode 135 and second main electrode 136 at a partial region thereof, so that a region between regions of the semiconductor layer 133 in contact with partial regions of the impurity semiconductor layer 134 serves as the channel region of the TFT. The control electrode 131 is electrically connected to a control line 15, the first main electrode 135 is electrically connected to a signal line 16, and the second main electrode 136 is electrically connected to a pixel electrode 122 of the conversion device 12. Note that in the present embodiment, the first main electrode 135, second main electrode 136, and signal line 16 are integrally configured to the same conductive layer, with the first main electrode 135 making up part of the signal line 16. A protection layer 137 is provided so as to cover the TFT 13, control line 15, and signal line 16. While an inverted stagger type TFT using the semiconductor layer 133 and impurity semiconductor layer 134 primarily formed of amorphous silicon is used as the switching device in the present embodiment, the disclosure is not restricted to this. Other examples include using a stagger type TFT formed primarily of polycrystalline silicon, or using an organic TFT, an oxide TFT, or the like.

The inter-layer insulating layer 120 is disposed between the substrate 100 and the pixel electrode 122 of the conversion device 12 which will be described later, so as to cover the multiple TFTs 13. Contact holes are formed in the inter-layer insulating layer 120. The pixel electrode 122 of the conversion device 12 and the second main electrode 136 of the TFT 13 are electrically connected by a contact hole formed in the inter-layer insulating layer 120.

The conversion device 12 includes, disposed on the inter-layer insulating layer 120 in order from the inter-layer insulating layer side (substrate side), the pixel electrode 122, a impurity semiconductor portion 123 of a first conductivity type, a semiconductor portion 125, a impurity semiconductor portion 126 of a second conductivity type, and a counter electrode 127. The pixel electrode 122 is provided with a polycrystalline transparent conductive oxide, in order to raise light irradiation efficiency and reduce afterimages, and to reduce resistance. A light source for irradiating light for reduction afterimages, which is not illustrated, may be situated on the surface facing the surface of the substrate 100 where the pixel 11 has been situated. While indium tin oxide (ITO) is used as the transparent conductive oxide in the present embodiment, the disclosure is not restricted to this, and any having light transmittance of 20% or more as to the light emitted from the light source may be used. Other suitably used examples include ZnO, $SnO_2$, $CuAlO_2$, and so forth.

The impurity semiconductor portion 123 of the first conductivity type exhibits polarity of a first conductivity type, and has a higher concentration of dopant than the semiconductor portion 125 and the impurity semiconductor portion 126 of the second conductivity type. The impurity semiconductor portion 126 of the second conductivity type exhibits polarity of a second conductivity type, and has a higher concentration of dopant than the impurity semiconductor portion 123 of the first conductivity type and the semiconductor portion 125. The impurity semiconductor portion 126 of the second conductivity type corresponds to the "other impurity semiconductor portion" as used elsewhere in the Present Specification. The first conductivity type and the second conductivity type are conductivity types with different polarities from each other. While the first conductivity type is n-type and the second conductivity type is p-type in the present embodiment, the disclosure is not restricted to this, so the first conductivity type may be p-type and the second conductivity type n-type.

An electrode line 14 is electrically connected to the counter electrode 127 of the conversion device 12. The pixel electrode 122 of the conversion device 12 is electrically connected to the second main electrode 136 of the TFT 13 via the contact hole formed in the inter-layer insulating layer 120. A photodiode using the impurity semiconductor portion 123 of the first conductivity type, the semiconductor portion 125, and the impurity semiconductor portion 126 of the second conductivity type, primarily formed of amorphous silicon, is used in the present embodiment.

Now, transparent conductive oxides have many lattice flaws, and in particular polycrystalline transparent conductive oxides have more lattice flaws than amorphous transparent conductive oxides. Further, higher concentration of dopant in the impurity semiconductor portion 123 increases lattice flaws. Increased lattice flaws in the impurity semiconductor portion 123 reduces adhesion between the impurity semiconductor portion 123 and the transparent conductive oxide. On the other hand, lower concentration of dopant in the impurity semiconductor portion 123 increases reverse saturation current when the PIN type photodiode is under reverse bias, i.e., dark current. This is because lower concentration of dopant in the impurity semiconductor portion 123 leads to lower activation energy, minority carrier density in the impurity semiconductor portion 123 increases, and functions blocking the minority carriers deteriorate.

Accordingly, the impurity semiconductor portion 123 includes the first region including a location in contact with the transparent conductive oxide, and a second region situated closer to the semiconductor portion 125 than the first region. The density of the dopant in the second region is higher than the concentration of the dopant in the first region. Having the first region of which the dopant concentration is lower than the second region being in contact with the transparent conductive oxide enables the adhesion as to the transparent conductive oxide to be higher as compared to a case where the second region is in contact with the transparent conductive oxide. For example, if the semiconductor portion 125 is amorphous silicon and the impurity semiconductor portion 123 us an n-type amorphous silicon, the concentration of phosphorous which is the dopant in the first conductivity type in the first region is preferably less than $1.0 \times 10^{21}$ atoms/cc. This phosphorous concentration is measured by secondary ion mass spectrometry (SIMS) analysis. In this case, the electric conductivity in the first region is less than $5.0 \times 10^{-4}$ $(\Omega \text{ cm})^{-1}$, and the activation energy is less than 0.3 eV. Also, since there is correlation between the concentration of the dopant and the concentration of hydrogen in the amorphous silicon, the concentration of hydrogen in the first region is $1.0 \times 10^{22}$ atoms/cc or more according to SIMS analysis. The second region where the dopant concentration is higher than the first region enables sufficient activation energy to block the minority carriers to be secured, and thus increase of dark current can be suppressed. For example, if the semiconductor portion 125 is amorphous silicon and the impurity semiconductor portion 123 is an n-type amorphous silicon, the concentration of phosphorous in the second region is preferably $1.0 \times 10^{21}$ atoms/cc or more by SIMS analysis. In this case, the electric conductivity in the second region is $5.0 \times 10^{-4}$ $(\Omega \text{ cm})^{-1}$ or more, the activation energy in the second region is $1.0 \times 10^{21}$ eV or more, and the concentration of hydrogen in the second region is less than $1.0 \times 10^{22}$ atoms/cc.

While a photodiode using the impurity semiconductor portion 123 of the first conductivity type, the semiconductor portion 125, and the impurity semiconductor portion 126 of the second conductivity type, primarily formed of amorphous silicon, has been used in the present embodiment, the disclosure is not restricted to this. For example, a device directly converting radiation into charge, using the impurity semiconductor portion 123 of the first conductivity type, the semiconductor portion 125, and the impurity semiconductor portion 126 of the second conductivity type, primarily formed of amorphous selenium, may be used. The counter electrode 127 is disposed facing the pixel electrode 122, and is electrically connected to the electrode line 14. In the present embodiment, the surface of the inter-layer insulating layer 120 is covered by the pixel electrode 122 and the covering member 121 formed of an inorganic material. Thus suppresses the surface of the inter-layer insulating layer 120 from being exposed when forming the impurity semiconductor film to serve as the impurity semiconductor portion 123 by chemical vapor deposition (CVD), vapor deposition, sputtering, or the like. Accordingly, inclusion of organic material in the impurity semiconductor portion 123 can be reduced. Also, in the present embodiment, the impurity semiconductor portion 123, semiconductor portion 125, and impurity semiconductor portion 126 are divided or removed for each pixel, on the covering member 121 covering the surface of the inter-layer insulating layer 120, along with the pixel electrode 122. At the time of dividing or removing, the covering member 121 serves as an etching stopper layer. Accordingly, the inter-layer insulating layer 120 is not subjected to the etch species in dry etching, and contamination of the conversion device by organic material can be suppressed. A passivation layer 128 is further provided, so as to cover the electrode line 14, conversion device 12, and covering member 121.

Figure 2:
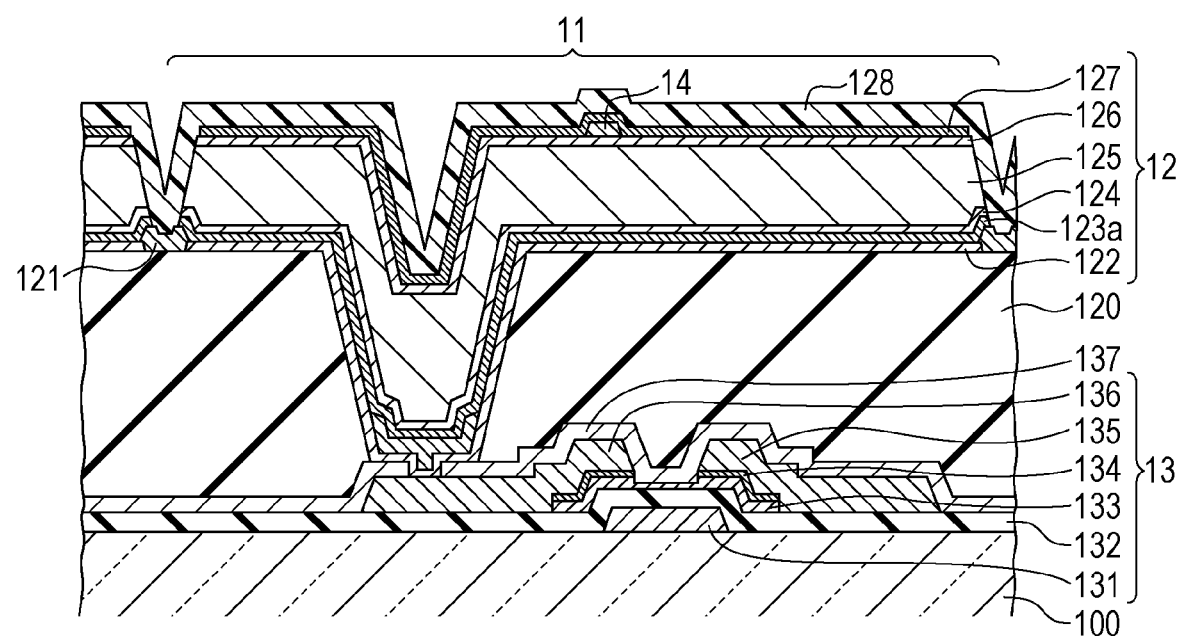
FIG. 2 is a cross-sectional schematic view for one pixel in the detecting device according to another example of the first embodiment.

While description has been regarding the form illustrated in FIG. 1B that the impurity semiconductor portion 123 of the first conductivity type includes a first region and a second region, the disclosure is not restricted to this. An arrangement may be made such as illustrated in FIG. 2, where the impurity semiconductor portion 123 is formed of a first impurity semiconductor layer 123a and a second impurity semiconductor layer 124. In this case, the first impurity semiconductor layer 123a corresponds to the first region, and the second impurity semiconductor layer 124 corresponds to the second region.

Next, a manufacturing method of the detecting device according to the first embodiment will be described with reference to FIGS. 3A through 4D. Particularly detailed description will be given regarding a process to form the pixel electrode 122 and thereafter, with reference to mask patterns and cross-sectional view illustrating the process. Note that FIGS. 3A, 3C, 4A, and 4C are cross-sectional schematic diagrams at the position corresponding to IB-IB in FIG. 1A, at each process. FIGS. 3B, 3D, 4B, and 4D are plan schematic views of mask patterns for the photo masks used in each process for the pixel illustrated in FIG. 1A.

First, a TFT 13 is provided on the insulating substrate 100, and a protection film is formed so as to cover the TFT 13. Next, acrylic resin which is an organic insulating material having photosensitivity is formed as an inter-layer insulating film so as to cover the TFT 13 and protection film, using a coating device such as a spinner or the like. Other examples of organic materials having photosensitivity which can be used include polyimide resin and so forth. The protection layer 137 having contact holes and the inter-layer insulating layer 120 are formed by exposure and developing processing, using suitable masks. Next, in the process illustrated in FIG. 3A, a conductive film is formed so as to cover the inter-layer insulating layer 120. The conductive film is then etched using the mask illustrated in FIG. 3B, so as to form the pixel electrode 122 of the conversion device. In the present embodiment, an amorphous transparent conductive oxide film formed of ITO is used as the conductive film. The amorphous transparent conductive oxide film is subjected to wet etching using the mask illustrated in FIG. 3B, and made into a polycrystalline material by annealing, so as to form the pixel electrode 122 of the conversion device. Further, wet etching may be performed using a hydrofluoric acid etchant, to remove the surface oxide on the pixel electrode 122.

Figure 3D:
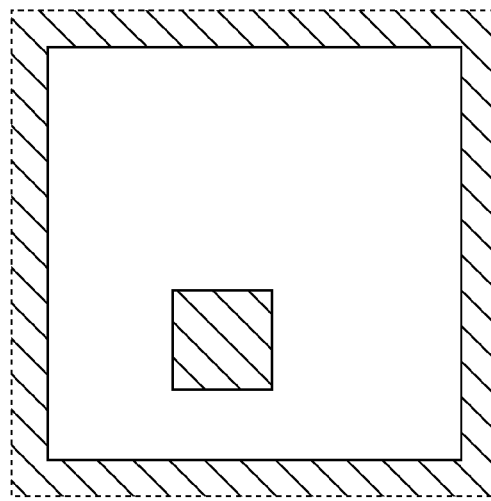
Figure 3C:
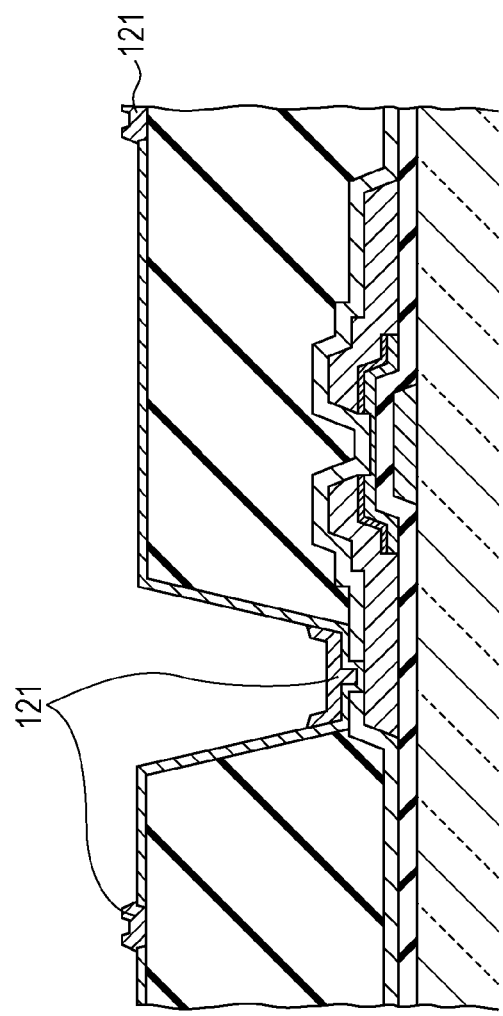

Next, in the process illustrated in FIG. 3C, an insulating film formed of an inorganic material like a silicon nitride film or silicon oxide or the like is formed by plasma CVD, so as to cover the inter-layer insulating layer 120 and the pixel electrode 122. The insulating film is then etched using the mask illustrated in FIG. 3D to form the covering member 121, such that the surface regions of the inter-layer insulating layer 120 not covered by the pixel electrode 122 are covered. Thus, the surface of the inter-layer insulating layer 120 is covered by the covering member 121 and the pixel electrode 122. While an example has been illustrated in the present embodiment where the covering member 121 is formed using an inorganic insulating material, the disclosure is not restricted to this, and any inorganic film which can cover the surface will suffice. For example, an arrangement may be made wherein, the regions of the covering member 121 which comes into contact with the pixel electrode 122 and the impurity semiconductor portion 123 are formed of an inorganic insulating material, and the other regions are formed of an inorganic conductive material such as ITO, Al, Cu, or the like. Also, the covering member 121 is formed at the contact hole formed in the inter-layer insulating layer 120 so as to cover the step difference of the protection layer 137 and the step difference of the inter-layer insulating layer 120. This suppresses the second main electrode 136 and protection layer 137 from being subjected to etching, thereby protecting the second main electrode 136 and protection layer 137.

Figure 4B:
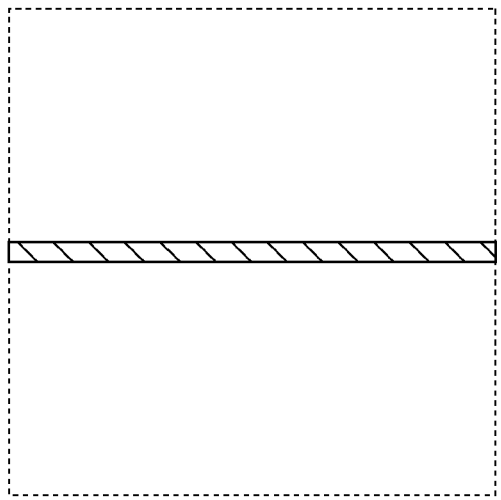
FIGS. 4B and 4D are mask patterns for illustrating the manufacturing method of the detecting device according to the first embodiment.
Figure 4A:
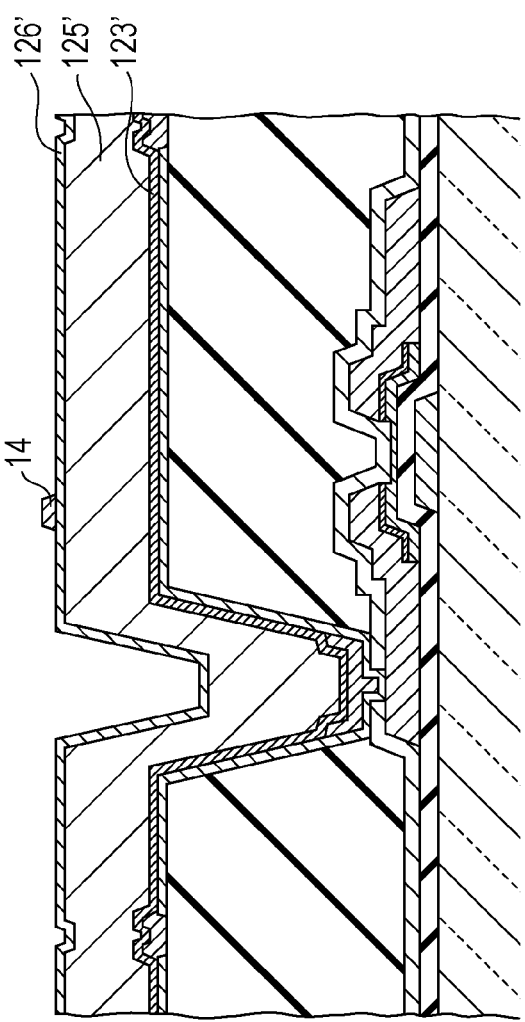
FIGS. 4A and 4C are cross-sectional schematic views illustrating a manufacturing method of the detecting device according to the first embodiment.

Next, in the process illustrated in FIG. 4A, an n-type amorphous silicon film into which pentavalent phosphorus has been doped, is formed as a impurity semiconductor film 123' of a first conductivity type by plasma CVD, so as to cover the covering member 121 and the pixel electrode 122. Specifically, a plasma CVD device is used which employs $SiH_4$ as the primary source gas, $PH_3$ as the secondary source gas, and $H_2$ as the diluting gas. At the time of forming the impurity semiconductor film 123' of the first conductivity type, the surface of the transparent conductive oxide may be reduced to form unevenness. Excessive unevenness can lead to flaws in the impurity semiconductor film 123' that is formed, resulting in influence of dark current due to defects. Accordingly, the impurity semiconductor film 123' is formed such that energy reducing the surface of the transparent conductive oxide is suppressed. Forming the impurity semiconductor film 123' such that energy reducing the surface of the transparent conductive oxide is suppressed reduces the concentration of the dopant phosphorus in the impurity semiconductor film 123'. That is to say, the concentration of dopant in the first region of the impurity semiconductor film 123' to serve as the impurity semiconductor portion 123, including the portion in contact with the transparent conductive oxide, is preferably low, having been formed with an energy such that reduction of the surface of the transparent conductive oxide can be suppressed. However, if forming of the impurity semiconductor film 123' is performed on the entire region of the impurity semiconductor portion 123, the concentration of dopant will be low for the entire region of the impurity semiconductor portion 123, leading to increased reverse saturation current when the PIN type photodiode is under reverse bias, i.e., increased dark current. Also, if the dopant concentration in the impurity semiconductor portion 123 is low, the resistivity of the impurity semiconductor portion 123 increases. Accordingly, a sufficiently high concentration of dopant is preferable for the overall impurity semiconductor portion 123. Therefore, the concentration of the dopant in the second region of the impurity semiconductor film 123' formed after the first region is preferably high, so that increased dark current and increased resistivity can be suppressed. That is to say, the impurity semiconductor film 123' is preferably formed such that the concentration of dopant in the first region of the impurity semiconductor film 123' in contact with the portion coming into contact with the transparent conductive oxide is lower than the concentration of dopant in the second region formed after the first region.

This first example, where such a impurity semiconductor film 123' is formed by CVD using a primary source gas, secondary source gas, and diluting gas, involves the partial pressure of the primary source gas at the time of forming the first region being higher than the partial pressure of the primary source gas at the time of forming the second region. A second example involves controlling film formation temperature. Specifically, the film formation temperature at the time of forming the first region is controlled so as to be lower than the film formation temperature at the time of forming the second region. According to the first example and second example, the deposition rate of the impurity semiconductor film is increased, so the amount of time where the transparent conductive oxide is exposed during film formation can be reduced and reduction of the surface of the transparent conductive oxide can be suppressed. According to a third example, the electric power applied between the anode electrode and cathode electrode of the CVD device at the time of forming the first region by CVD (radio frequency (RF) power) is controlled to be lower than the electric power applied at the time of forming the second region. Note that a plasma CVD device is used as the CVD device in the present embodiment. In the second and third examples, the energy applied to the surface of the transparent conductive oxide is reduced by the $SiH_4$ which is the primary source gas, $PH_3$ which is the secondary source gas, $H_2$ which is the diluting gas, and various types of ions generated based on these. Accordingly, reduction of the surface of transparent conductive oxide can be suppressed.

Controlling the above-described conditions to form the impurity semiconductor film 123' in this way allows a impurity semiconductor film 123, having a first region where dopant concentration is low, and a second region formed after the first region where dopant concentration is high. The concentration of phosphorous which is the dopant in the first conductivity type in the first region is preferably less than $1.0 \times 10^{21}$ atoms/cc by SIMS analysis. In this case, the electric conductivity in the first region is less than $5.0 \times 10^{-4}$ $(\Omega\ cm)^{-1}$, and the activation energy is less than 0.3 eV. Also, since there is correlation between the concentration of the dopant and the concentration of hydrogen in the amorphous silicon, the concentration of hydrogen in the first region is $1.0 \times 10^{22}$ atoms/cc or more according to SIMS analysis. Also, the concentration of phosphorous in the second region is preferably $1.0 \times 10^{21}$ atoms/cc or more by SIMS analysis. In this case, the electric conductivity in the second region is $5.0 \times 10^{-4}$ $(\Omega \text{ cm})^{-1}$ or more, the activation energy in the second region is $1.0 \times 10^{22}$ eV or more, and the concentration of hydrogen in the second region is less than $1.0 \times 10^{22}$ atoms/cc. The control conditions according to the first through third examples may be performed gradually, or may be performed instantaneously at a certain point. That is to say, the dopant concentration of the impurity semiconductor film 123' may change gradually or rapidly. In a case of changing rapidly, the impurity semiconductor film will be a multi-layer structure, with a impurity semiconductor portion being configured by a first impurity semiconductor layer 123a and second impurity semiconductor layer 124 such as illustrated in FIG. 2. In this case, first, a first impurity semiconductor film to become the first impurity semiconductor layer 123a is formed in contact with the transparent conductive oxide to become the pixel electrode 122. Next, a second impurity semiconductor film having the same polarity with the first impurity semiconductor film is formed on the first impurity semiconductor film, thereby forming a impurity semiconductor film covering the transparent conductive oxide and serving as the impurity semiconductor portion.

Returning to FIG. 4A, a semiconductor film 125' formed of an amorphous silicon film, and an amorphous silicon film in which trivalent boron has been doped as a impurity semiconductor film 126' of the second conductivity type, are formed by plasma CVD in that order, following formation of the impurity semiconductor film 123'.

Next, a conductive film of Al or the like is formed by sputtering or the like to cover the impurity semiconductor film 126', to serve as the electrode line 14. This conductive film is then subjected to wet etching using the mask illustrated in FIG. 4B, thereby forming the electrode line 14.

Note that at the time of forming the impurity semiconductor film 123', the inter-layer insulating layer 120 will be exposed to plasma if the inter-layer insulating layer 120 is not covered by the covering member 121 and pixel electrode 122. If the inter-layer insulating layer 120 formed of organic material is exposed to plasma, the organic material may scatter and contaminate the impurity semiconductor film 123'. Accordingly, the present embodiment is configured such that the inter-layer insulating layer 120 is covered by the covering member 121 and pixel electrode 122, so that the surface of the inter-layer insulating layer 120 is not exposed when forming the impurity semiconductor film 123', thereby preventing contamination of the impurity semiconductor film 123' by scattering organic material.

Figure 4D:
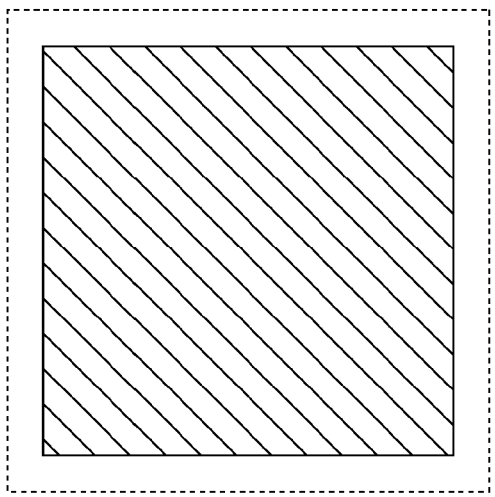
Figure 4C:
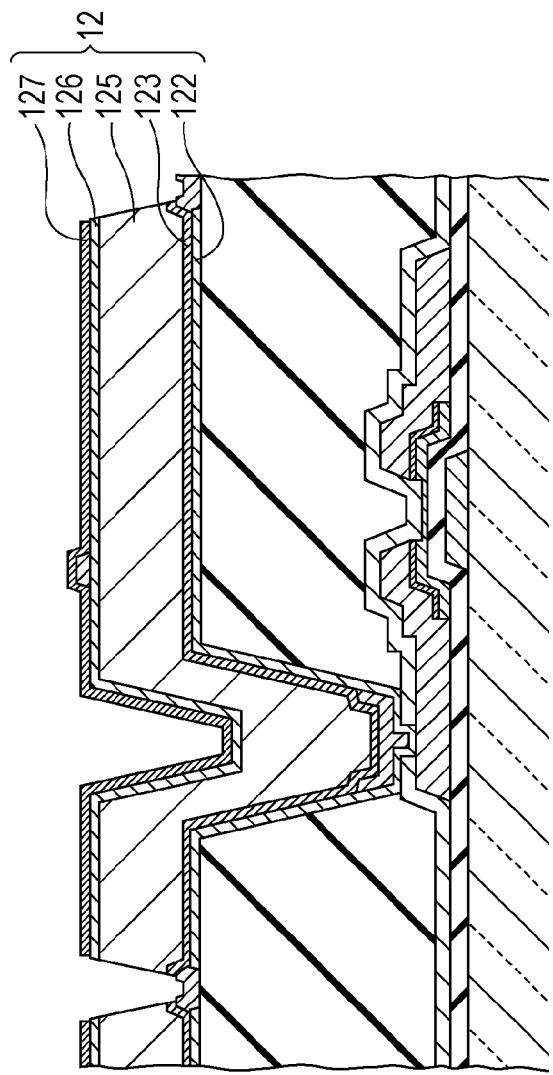

Next, in the process illustrated in FIG. 4C, a film of transparent conductive oxide is formed by sputtering to cover the impurity semiconductor film 126' and electrode line 14. Next, the transparent conductive oxide film is subjected to wet etching using the mask illustrated in FIG. 4D, thereby forming the counter electrode 127 of the conversion device 12. The same mask illustrated in FIG. 4D is then used to remove the impurity semiconductor film 126', semiconductor film 125', and impurity semiconductor film 123', by dry etching. This realizes element isolation of the conversion devices 12 for each pixel. The conversion devices 12 formed by pixel isolation include the impurity semiconductor portion 126, semiconductor portion 125, and impurity semiconductor portion 123, which have been formed. This element isolation by dry etching is performed upon the covering member 121. Accordingly, the covering member 121 functions as an etching stopper layer, the inter-layer insulating layer 120 is not subjected to the etch species in dry etching, and contamination of the layers by organic material can be suppressed. Also, the pixel electrode 122 is covered by the impurity semiconductor portion 123, thereby forming a configuration with no Schottky connection directly connecting the pixel electrode 122 and semiconductor layer 124. While a transparent conductive oxide has been used as the material for the counter electrode 127 in the present embodiment, the disclosure is not restricted to this, and any conductive film will suffice. For example, in a case of using a device directly converting radiation into charge as the conversion device, a conductive film such as Al which readily transmits radiation may be used. A passivation layer 128 is then formed to cover the conversion device 12 and covering member 121, thereby obtaining the configuration illustrated in FIG. 1B.

Figure 5:
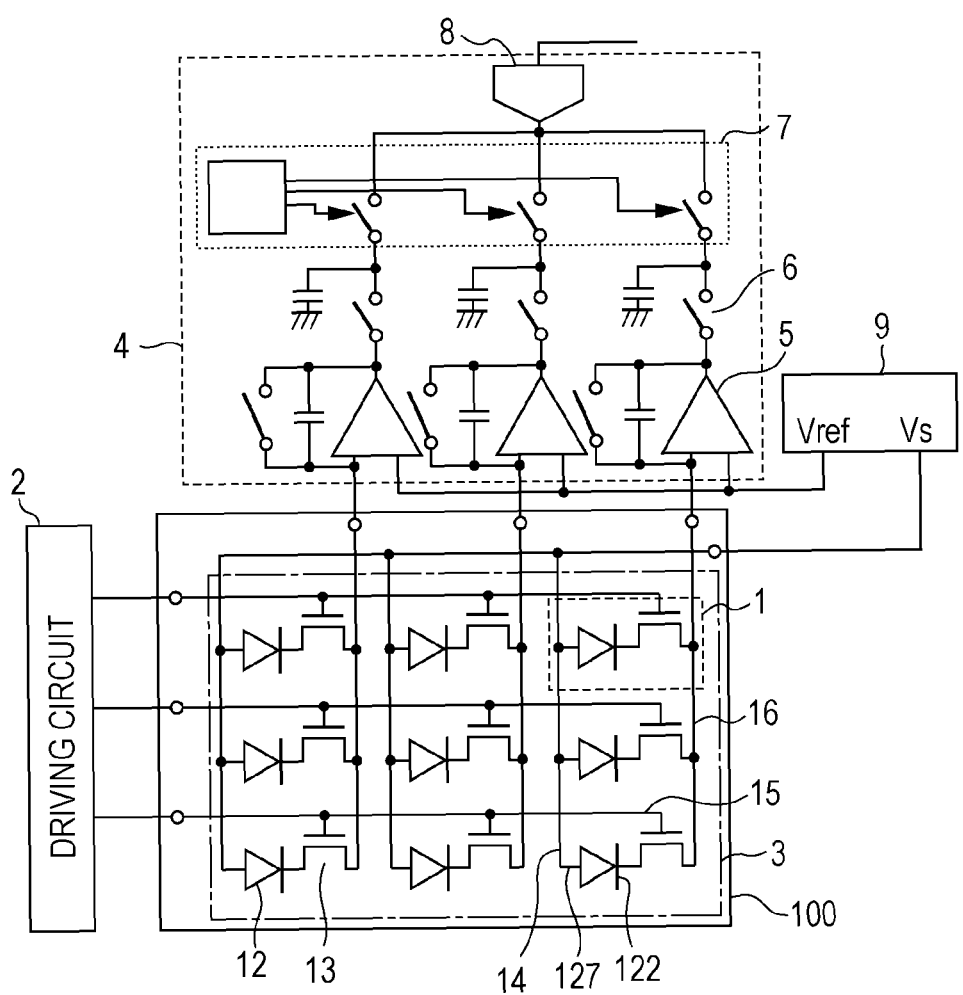
FIG. 5 is a schematic equivalent circuit diagram of the detecting device.

A schematic equivalent circuit of the detecting device according to the first embodiment will be described with reference to FIG. 5. While a 3-row by 3-column equivalent circuit diagram is illustrated in FIG. 5 to simplify illustrating, the disclosure is not restricted to this, and has a pixel array of n rows and m columns (where n and m are both natural numbers that are 2 or greater). The detecting device according to one embodiment has a converting unit 3 including multiple pixels 1 arrayed in the row direction and column direction, arrayed on the surface of the substrate 100. Each pixel 1 includes a conversion device 12 which converts radiation or light into electrical charge, and a TFT 13 which outputs electrical signals corresponding to the charge of the conversion device 12. A scintillator (not illustrated) may be disposed on the surface of the conversion device at the side of the counter electrode 127, to perform wavelength conversion of radiation into visible light. The electrode line 14 is connected in common to the counter electrodes 127 of multiple conversion devices 12 arrayed in the column direction. The control line 15 is connected in common to the control electrodes 131 of multiple TFTs 13 arrayed in the row direction, and is electrically connected to a driving circuit 2. The driving circuit 2 sequentially or simultaneously supplies drive pulses to multiple control lines 15 arrayed in the column direction, whereby electrical signals from pixels in row increments are output in parallel to multiple signal lines 16 arrayed in the row direction. Each signal line 16 is connected in common to first main electrodes 135 of the multiple TFTs 13 arrayed in the column direction, and is electrically connected to a read circuit 4. The read circuit 4 includes integrating amplifiers 5 which integrate and amplify electrical signals from the signal lines 16, and sample hold circuits 6 which perform sample holding of the electrical signals amplified at the integrating amplifiers 5 and output. The read circuit 4 further includes a multiplexer 7 which converts electrical signals output from the multiple sample hold circuits 6 in parallel into serial electrical signals, and an A/D converter 8 which converts the output electrical signals into digital data. A reference potential Vref from a power supply circuit 9 is supplied to non-inverting input terminals of the integrating amplifiers 5. The power supply circuit 9 is further electrically connected to the multiple electrode lines 14 arrayed in the row direction, and supplies a bias potential Vs to the counter electrodes 127 of the conversion device 12.

The operation of the detecting device according to the present embodiment will be described next. The reference potential Vref is supplied to the pixel electrodes 122 of the conversion devices 12 via the TFTs 13, and bias potential Vs necessary for electron-hole pair separation, generated by radiation or visible light, is applied to the counter electrodes 127. In this state, radiation which has passed through a specimen, or visible light corresponding thereto, is input to the conversion devices 12, converted into electrical charge, and stored in the conversion devices 12. The electrical signals corresponding to the electrical charges are output to the signal lines 16 by the TFTs 13 conducting due to driving pulses applied to the control lines 15 from the driving circuit 2, and externally read out as digital data by the read circuit 4.

Second Embodiment.

Figure 6A:
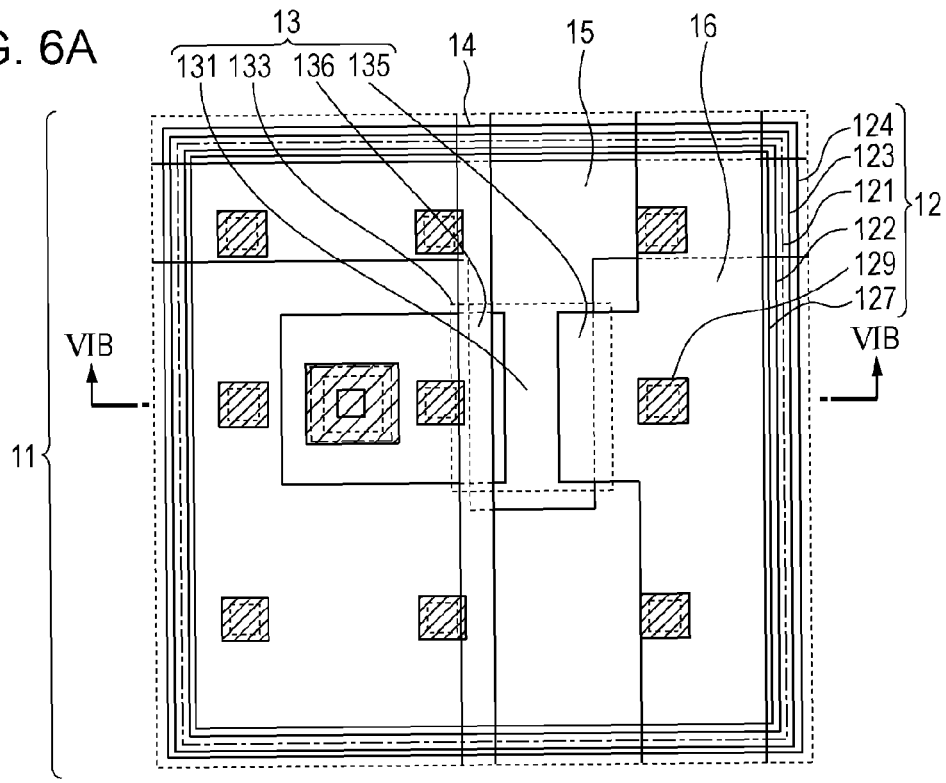
FIG. 6A is a plan schematic view for one pixel in a detecting device according to a second embodiment.
Figure 6B:
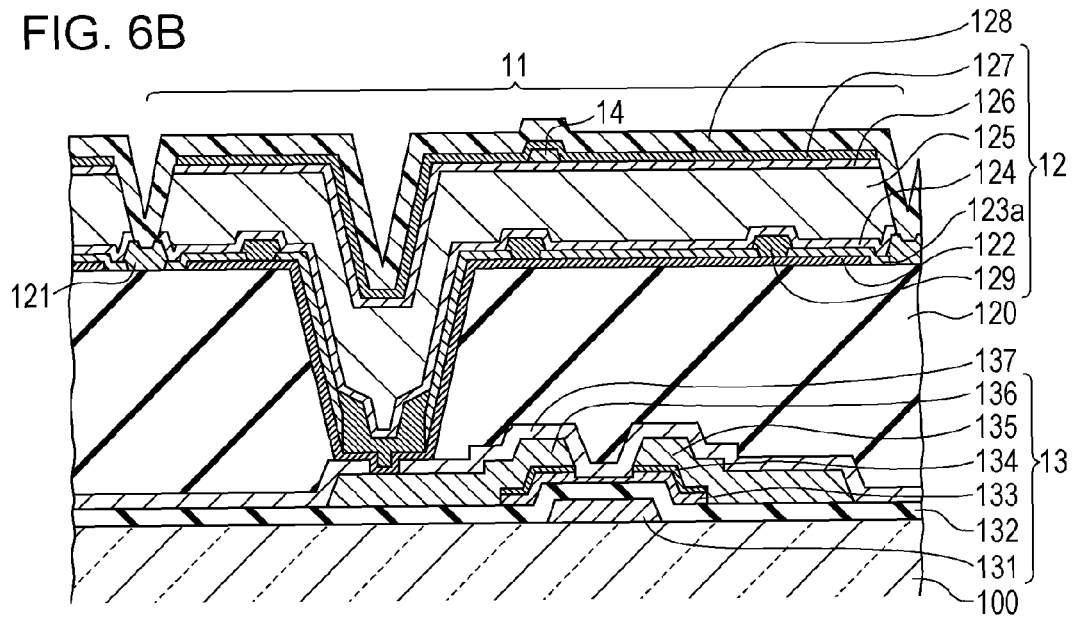
FIG. 6B is a cross-sectional schematic view for one pixel in the detecting device according to the second embodiment.

Next, a detecting device according to a second embodiment will be described with reference to FIGS. 6A and 6B. FIG. 6A is a plan schematic view for one pixel in the detecting device, and FIG. 6B is a cross-sectional schematic view taken along line VIB-VIB in FIG. 6A. Note that only the pixel electrode is illustrated for the conversion device in FIG. 6A, for sake of brevity. Components described in the previous embodiment are denoted with the same reference numerals, and detailed description thereof will be omitted.

In the present embodiment, metal members 129 are provided above a portion of the surface of the pixel electrode 122, in addition to the configuration of the first embodiment illustrated in FIGS. 1A and 1B. The metal members 129 are situated so as to be in direct contact with the second impurity semiconductor layer 124 and the pixel electrode 122, corresponding to the second region of the impurity semiconductor portion. As described in the first embodiment, lowering the dopant concentration in the first impurity semiconductor layer 123a corresponding to the first region of the impurity semiconductor portion to suppress deterioration in adhesion to the transparent conductive oxide may result in lower carrier mobility. Accordingly, in present embodiment, the second impurity semiconductor layer 124 which is the second region having higher dopant concentration than the first region is disposed so as to be in direct contact with the metal members 129 provided in contact with the pixel electrode 122. This suppresses deterioration in carrier mobility due to the first impurity semiconductor layer 123a. Also, the metal material used for the metal members 129 generally has higher adhesion to impurity semiconductor layers with a high concentration of dopant, and higher durability regarding formation of impurity semiconductor films, as compared to transparent conductive oxides, thus yielding a conversion device with more stable properties. Examples of materials which can be used for the metal member 129 include Al, Cu, Mo, W, and alloys thereof, or laminated structures of multiple materials. Mo which enables resistive connection to the impurity semiconductor layer 124 is used in the present embodiment.

Figure 7A:
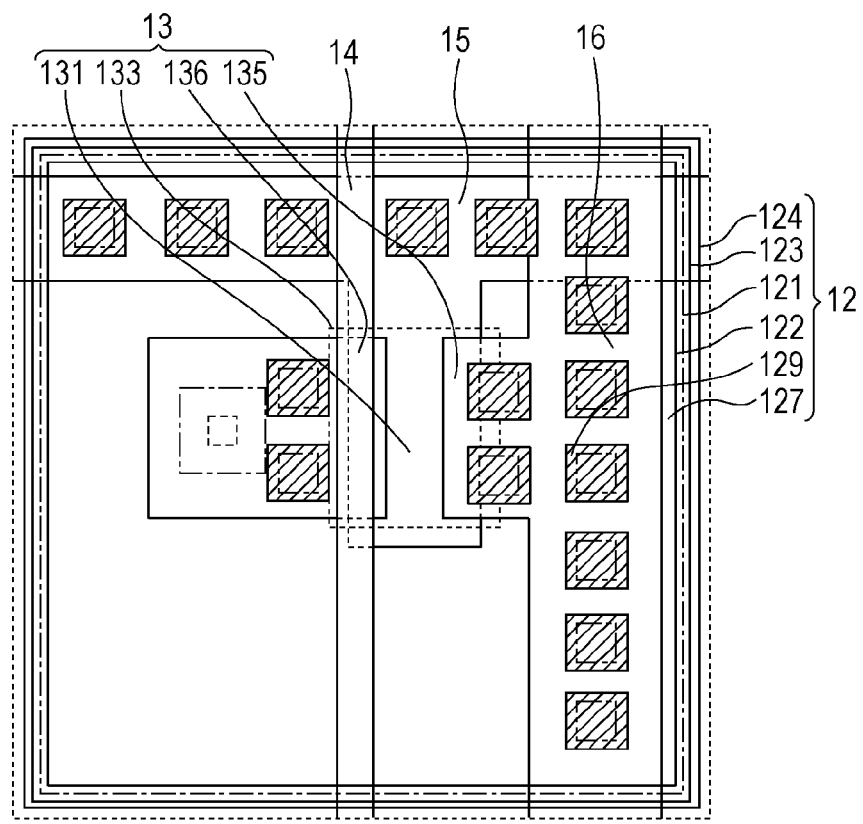
FIGS. 7A and 7B are plan schematic views for one pixel in a detecting device according to another example of the second embodiment.

Note however, that providing the metal members 129 may shield part of the light from a light source (not illustrated), which may be disposed to the surface of the substrate 100 opposite to the surface where the pixel 11 is disposed, from entering the semiconductor portion 125. Accordingly, The metal members 129 are preferably placed such that the orthogonal projection of the metal members 129 overlays at least one of the control line 15, signal line 16, control electrode 131, first main electrode 135, and second main electrode 136, as illustrated in FIG. 7A.

Figure 7B:
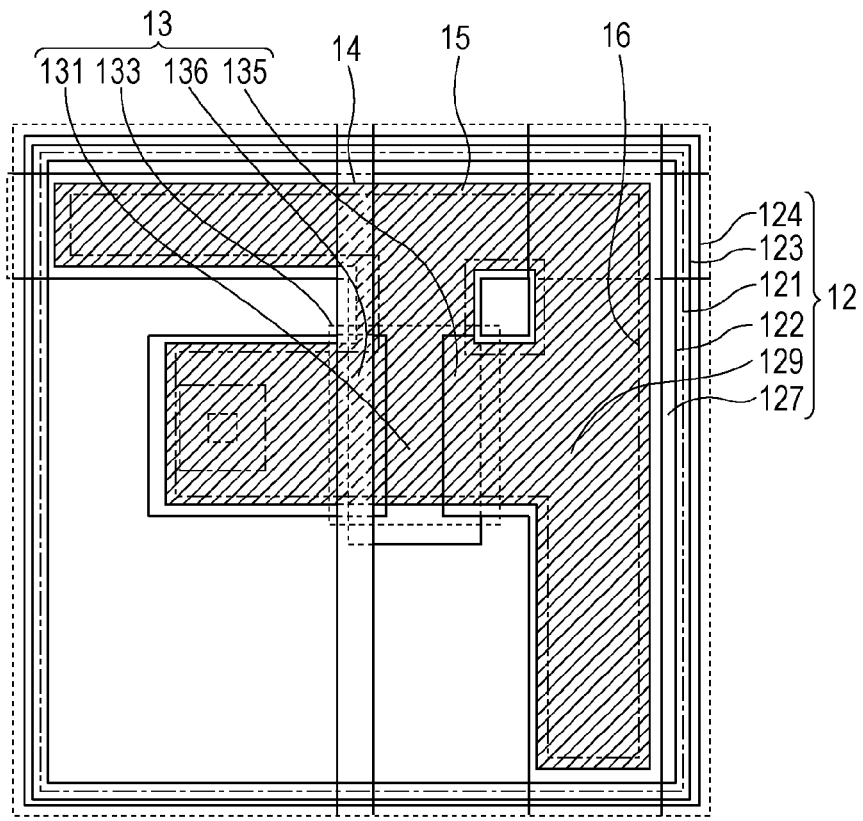

Alternatively, the metal members 129 may be provided integrally, and placed such that the orthogonal projection of the metal member 129 overlays at least one of the control line 15, signal line 16, control electrode 131, first main electrode 135, and second main electrode 136, as illustrated in FIG. 7B. The control line 15, signal line 16, control electrode 131, first main electrode 135, and second main electrode 136 are formed of a metal material with low light transmittance, to reduce resistance, and accordingly suppress transmission of light from the light source (not illustrated) to begin with. Accordingly, situating the metal member 129 such that the orthogonal projection thereof overlays these lines and electrodes enables further reduction in light transmission to be suppressed.

Figure 8B:
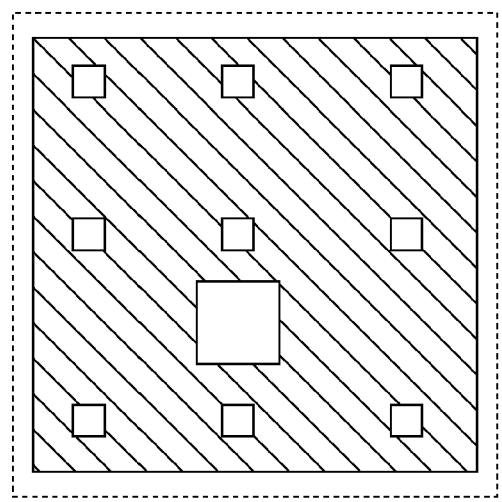
FIGS. 8B, 8D, and 8F are mask patterns for illustrating the manufacturing method of the detecting device according to the second embodiment.
Figure 8A:
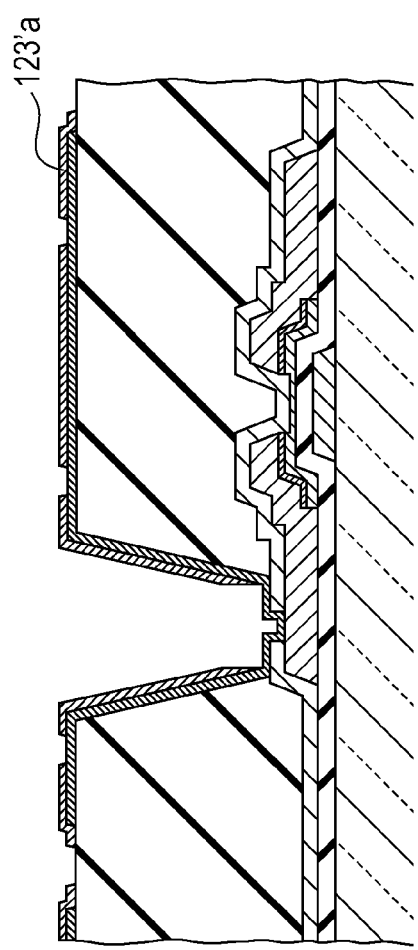
FIGS. 8A, 8C, and 8E are cross-sectional schematic views illustrating a manufacturing method of the detecting device according to the second embodiment.
Figure 8D:
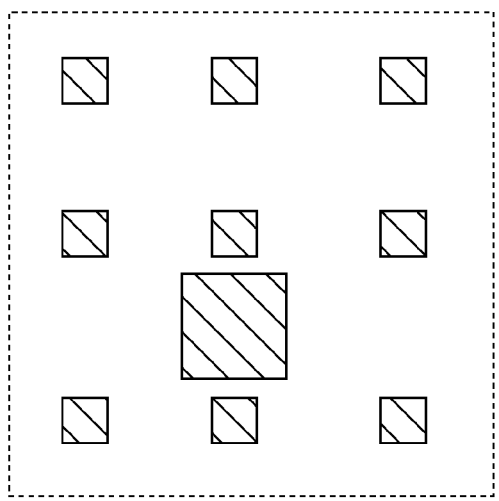
Figure 8C:
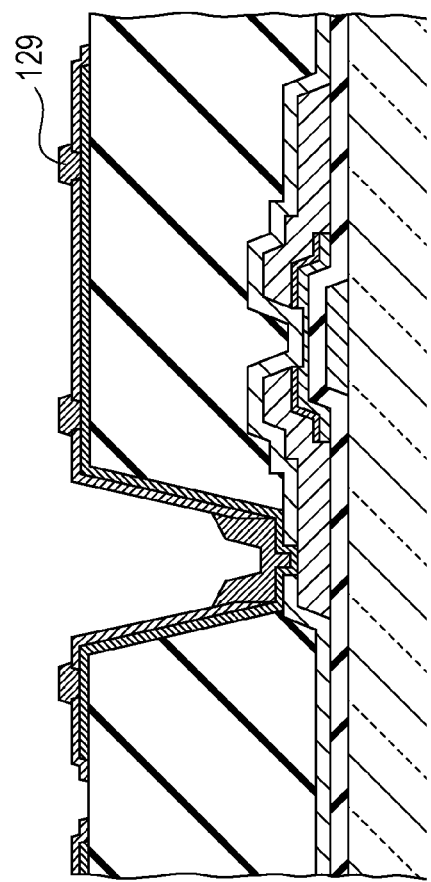
Figure 8F:
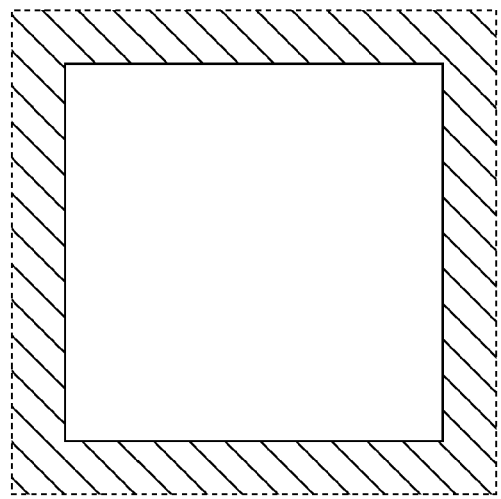
Figure 8E:
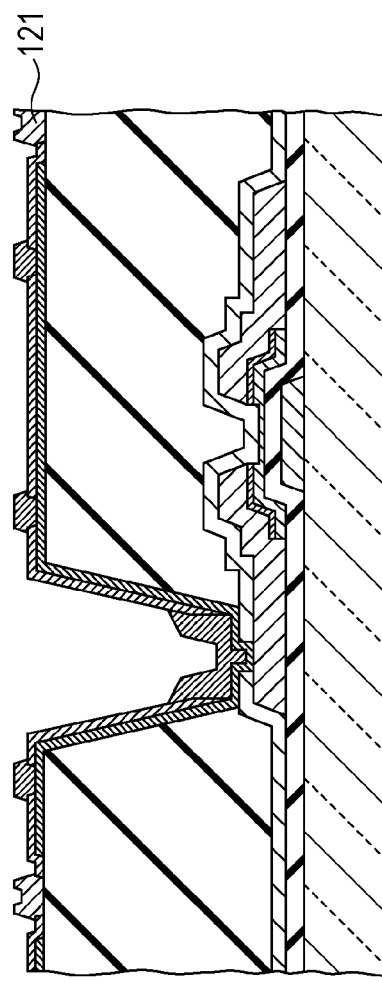

Next, a method for manufacturing the detecting device according to the second embodiment will be described with reference to FIGS. 8A through 8F. Processes the same as those described in the first embodiment will be omitted from detailed description. In particular, up to the process for forming the pixel electrode 122 is the same as that described with reference to FIGS. 3A and 3B, and the process following forming of the covering member 121 and first region is the same as that described with reference to FIGS. 4A through 4D, so other processes will be described. Note that FIGS. 8A, 8C, and 8E are cross-sectional schematic views at processes corresponding to the portion taken along line VIB-VIB in FIG. 6A. FIGS. 8B, 8D, and 8F are schematic plan views of mask patterns of photo masks used in the processes for the pixel illustrated in FIG. 6A.

In the process illustrated in FIG. 8A, an amorphous silicon film into which pentavalent phosphorus has been doped, is formed as a impurity semiconductor film 123'a of the first conductivity type by plasma CVD, so as to cover the inter-layer insulating layer 120 and the pixel electrode 122, formed as illustrated in FIG. 3A. The conditions for forming the impurity semiconductor film 123'a are the same as the first region of the impurity semiconductor film 123' or the first impurity semiconductor film 123' according to the first embodiment. Next, the impurity semiconductor film 123'a is removed by dry etching using the mask illustrated in FIG. 8B, thereby forming the first impurity semiconductor layer 123a.

Next, in the process illustrated in FIG. 8C, a metal film including Mo is formed by sputtering so as to cover the inter-layer insulating layer 120, pixel electrode 122, and first impurity semiconductor layer 123a. The metal film is then subjected to wet etching using the mask illustrated in FIG. 8D, thereby forming the metal member 129.

Next, in the process illustrated in FIG. 8E, an insulating film of a general inorganic material, such as silicon nitride or silicon oxide or the like, is formed by plasma CVD so as to cover the inter-layer insulating layer 120, pixel electrode 122, first impurity semiconductor layer 123a, and metal member 129. The insulating film is then etched using the mask illustrated in FIG. 8F, thereby forming the covering member 121 covering surface regions of the inter-layer insulating layer 120 not covered by the pixel electrode 122. Subsequently, an amorphous silicon film into which pentavalent phosphorus has been doped, is formed as a impurity semiconductor film 124' of the first conductivity type by plasma CVD, so as to cover the pixel electrode 122, first impurity semiconductor layer 123a, metal member 129, and covering member 121. The conditions for forming the impurity semiconductor film 124' are the same as the second region of the impurity semiconductor film 123' according to the first embodiment or the second impurity semiconductor film 124'. Accordingly, the impurity semiconductor film 124' serving as the second region of the impurity semiconductor layer is formed so as to be in contact with the metal member 129 which is in contact with the transparent conductive oxide of the pixel electrode 122. Subsequently, processes the same as the process to form the semiconductor film 125' and thereafter, described with reference to FIGS. 4A through 4D, are performed, yielding the configuration illustrated in FIG. 6B.

Third Embodiment

Figure 9A:
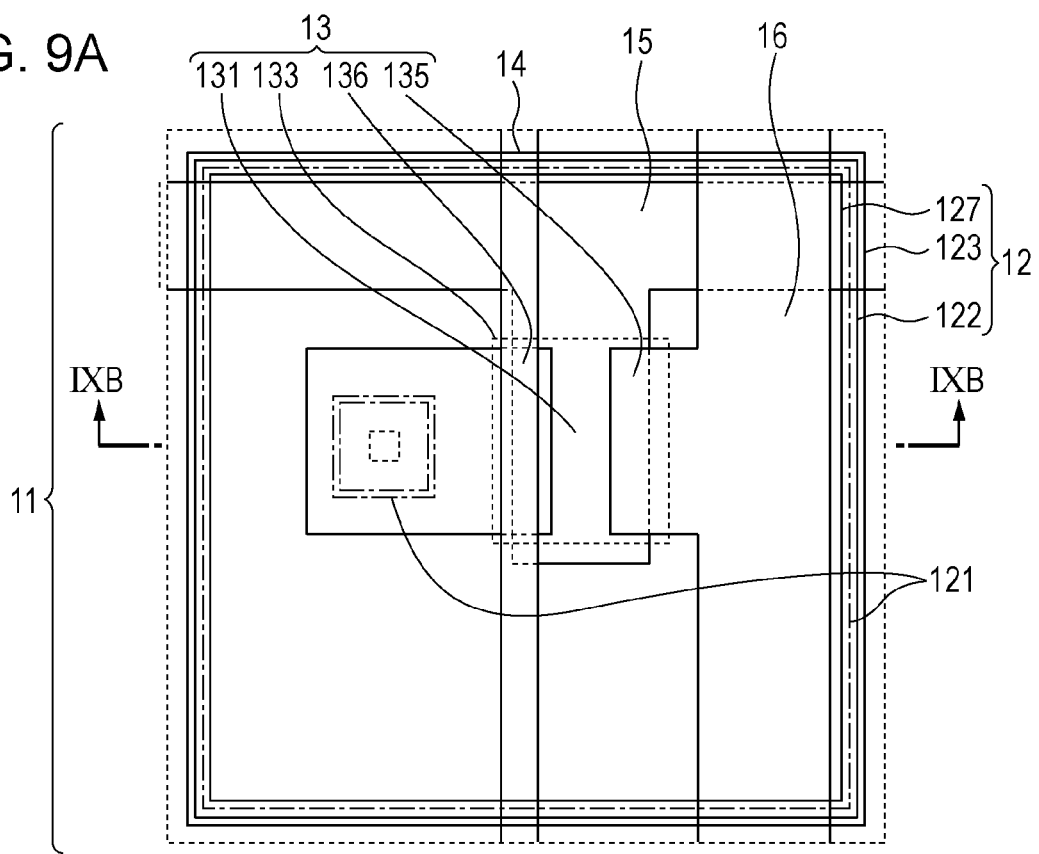
FIG. 9A is a plan schematic view for one pixel in a detecting device according to a third embodiment.
Figure 9B:
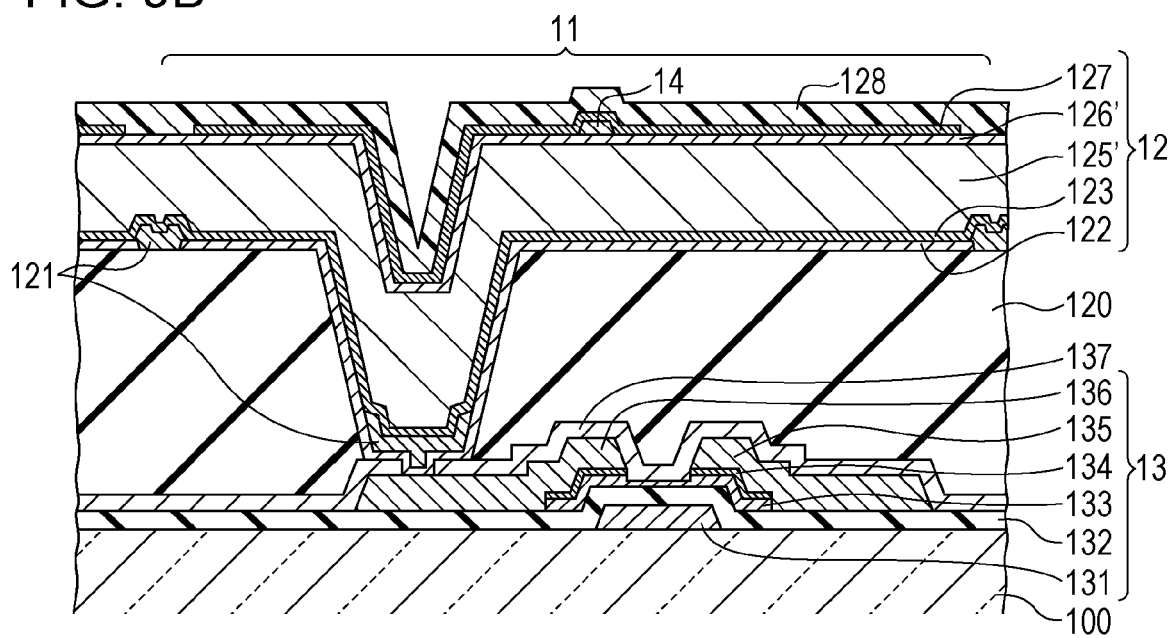
FIG. 9B is a cross-sectional schematic view for one pixel in the detecting device according to the third embodiment.

Next, a detecting device according to a third embodiment will be described with reference to FIGS. 9A and 9B. FIG. 9A is a plan schematic view for one pixel in the detecting device, and FIG. 9B is a cross-sectional schematic view taken along line IXB-IXB in FIG. 9A. Note that only the pixel electrode is illustrated for the conversion device in FIG. 9A, for sake of brevity. Components described in the previous embodiment are denoted with the same reference numerals, and detailed description thereof will be omitted.

In the present embodiment, a semiconductor film 125' is used as it is as the semiconductor portion, instead of the semiconductor portion 125 in the first embodiment illustrated in FIGS. 1A and 1B. Also, a impurity semiconductor film 126' is used as it is as the impurity semiconductor portion of the second conductive type, instead of the impurity semiconductor portion 126 of the second conductive type. That is to say, the configuration is such that the semiconductor portion and the impurity semiconductor portion of the second conductive type of the conversion device 12 are not separated for each pixel.

Figure 10B:
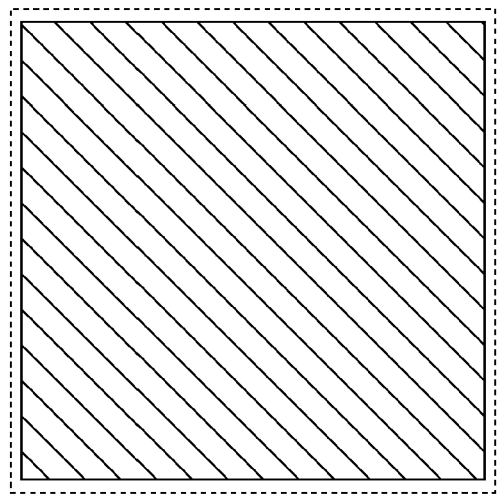
FIGS. 10B, 10D, and 10F are mask patterns for illustrating the manufacturing method of the detecting device according to the third embodiment.
Figure 10A:
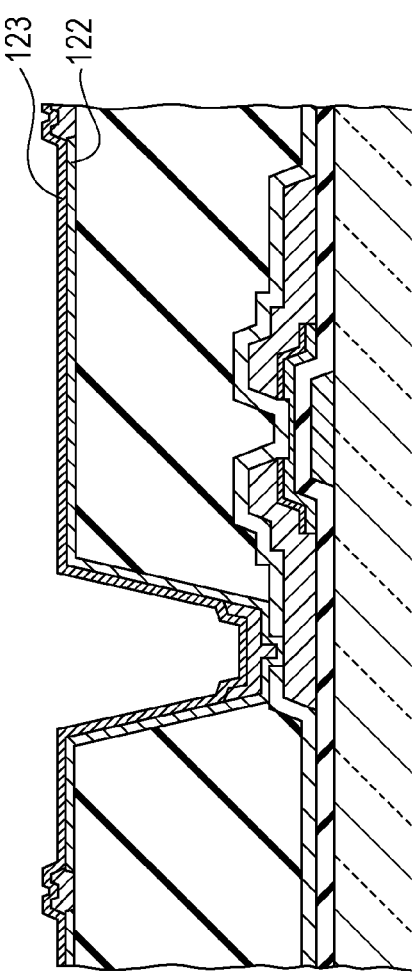
FIGS. 10A, 10C, and 10E are cross-sectional schematic views illustrating a manufacturing method of the detecting device according to the third embodiment.
Figure 10D:
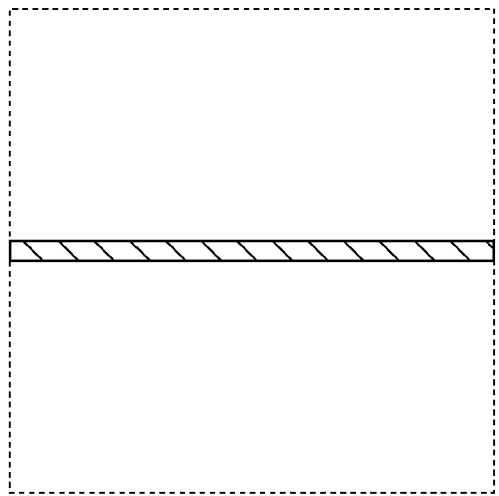
Figure 10C:
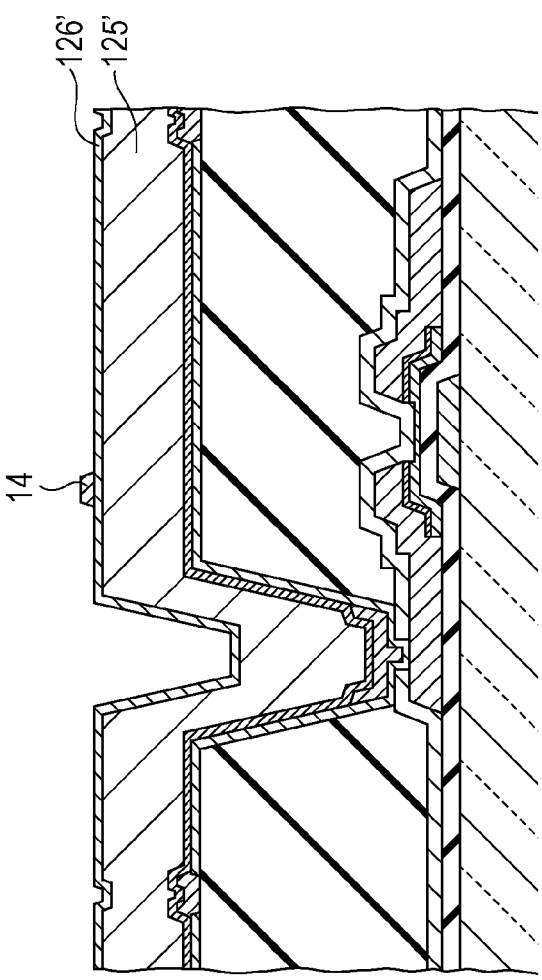
Figure 10F:
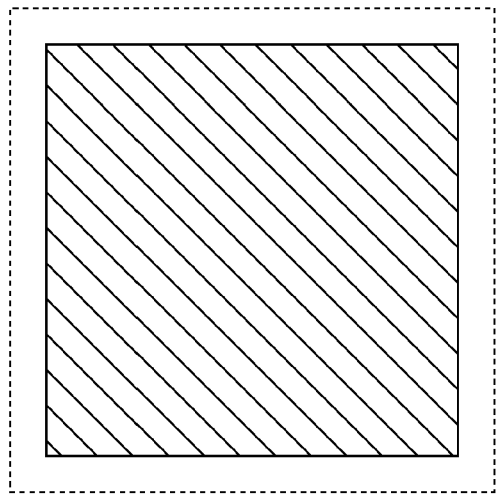
Figure 10E:
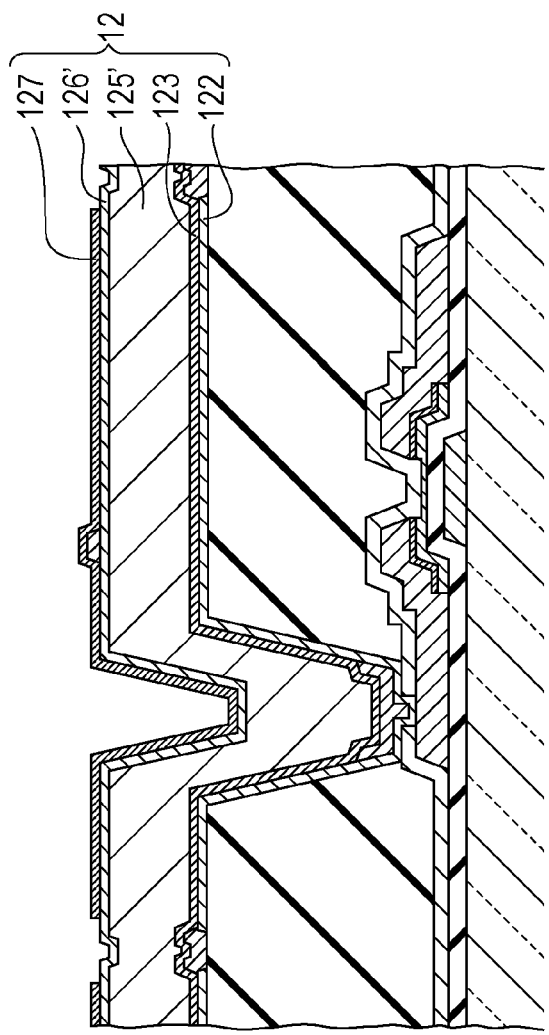

Next, a method for manufacturing the detecting device according to the third embodiment will be described with reference to FIGS. 10A through 10F. Processes that are the same as those described in the first embodiment will be omitted from detailed description. In particular, up to the process for forming the pixel electrode 122 and covering member 121 is the same as that described with reference to FIGS. 3A through 3D, so other processes will be described. Note that FIGS. 10A, 10C, and 10E are cross-sectional schematic views at the processes corresponding to the portion taken along line IXB-IXB in FIG. 9A. FIGS. 10B, 10D, and 10F are schematic plan views of mask patterns of photo masks used in the processes for the pixel illustrated in FIG. 9A.

In the process illustrated in FIG. 10A, an amorphous silicon film into which pentavalent phosphorus has been doped, is formed as a impurity semiconductor film 123' of the first conductivity type by plasma CVD, so as to cover the covering member 121 and pixel electrode 122, in the same way as with the first embodiment. Next, the impurity semiconductor film 123' is removed by dry etching using the mask illustrated in FIG. 10B, thereby forming the impurity semiconductor portion 123 of the first conductive type, with each pixel isolated.

In the process illustrated in FIG. 10C, a semiconductor film 125' formed of an amorphous silicon film is formed by plasma CVD, so as to cover the impurity semiconductor portion 123 and covering member 121. Subsequently, an amorphous silicon film in which trivalent boron has been doped as a impurity semiconductor film 126' of the second conductivity type is formed by plasma CVD. Next, a conductive film of Al or the like is formed by sputtering or the like to serve as the electrode line 14, so as to cover the impurity semiconductor film 126'. The conductive film is then subjected to wet etching using the mask illustrated in FIG. 10D, thereby forming the electrode line 14.

In the process illustrated in FIG. 10E, a film of a transparent conductive oxide is formed by sputtering so as to cover the impurity semiconductor film 126' and electrode line 14. The film of transparent conductive oxide is then subjected to wet etching using the mask illustrated in FIG. 10F, thereby forming the counter electrode 127 of the conversion device 12. The passivation layer 128 is then formed so as to cover the impurity semiconductor film 126' and counter electrode 127, yielding the configuration illustrated in FIG. 9B. While the counter electrodes 127 have been separated for each pixel in the present embodiment, the counter electrodes 127 do not have to be separated for each pixel.

Application Embodiment

Next, a radiation detecting system using the detecting device according to one embodiment will be described with reference to FIG. 11.

X-rays 6060 generated at an X-ray tube 6050 which is a radiation source pass through a chest 6062 of a patient or subject 6061, and enter the conversion devices included in the detecting device 6040 according to one embodiment. The incident X-rays include information regarding the inside of the body of the patient 6061. The conversion unit 3 converts the radiation into electric charges in accordance with input of the X-rays, and electric information is obtained. Thus information is then converted into digital data, subjected to image processing by an image processor 6070 serving as a signal processing unit, and can be observed on a display 6080 which is a display unit in a control room.

This information can also be transferred to a remote location by a transmission processing arrangement such as a telephone line 6090 or the like, and can be displayed in a display 6081 serving as a display unit in a remote doctor room or the like, saved in a storage medium such as an optical disc or the like, and further presented to a physician at a remote location for diagnosis. The information may also be recorded on film 6110 serving as a recoding medium, by a film processor 6100 serving as a recording device.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2013-103324 filed May 15, 2013 and No. 2013-103326 filed May 15, 2013, which are hereby incorporated by reference herein in their entirety.

What is claimed is:

1. A detecting device, comprising:
a detecting device including
a substrate,
a pixel electrode formed of a transparent conductive oxide,
an impurity semiconductor portion, and
a semiconductor portion,
wherein the pixel electrode, impurity semiconductor portion, and semiconductor portion are formed upon the substrate in that order from the substrate side;
wherein the impurity semiconductor portion includes
a first region including a place in contact with the pixel electrode, and
a second region situated nearer to the semiconductor portion than the first region;
and wherein a concentration of a dopant in the second region is higher than a concentration of a dopant in the first region.

2. The detecting device according to claim 1, further comprising:
a switching device disposed between the substrate and the pixel electrode; and
an inter-layer insulating layer interposed between the substrate and switching device, and the pixel electrode;
wherein a contact hole for electrical connection between the pixel electrode and the switching device is formed in the inter-layer insulating layer;
and wherein the pixel electrode and the switching device are electrically connected a the contact hole.

3. The detecting device according to claim 1, further comprising:
a metal member disposed above the pixel electrode, in contact with a part of the pixel electrode and the second region.

4. The detecting device according to claim 3,
wherein the switching device is a thin-film transistor having a control electrode, first main electrode, and second main electrode, the control electrode being electrically connected to a control line and the first main electrode connected to a signal line;
and wherein the metal member is disposed such that the orthogonal projection of the metal member overlays at least one of the control line, signal line, control electrode, first main electrode, and second main electrode.

5. The detecting device according to claim 2, further comprising:
a covering member disposed so as to cover the surface of the inter-layer insulating layer and the pixel electrode.

6. The detecting device according to claim 1,
wherein the semiconductor portion is formed of amorphous silicon, and the impurity semiconductor portion is formed of n-type amorphous silicon;
and wherein the concentration of dopant in the first region is less than $1.0 \times 10^{21}$, and the concentration of dopant in the second region is $1.0 \times 10^{21}$ or greater.

7. The detecting device according to claim 6,
wherein the conversion device includes
a counter electrode disposed facing the pixel electrode, and
another impurity semiconductor portion formed of p-type amorphous silicon, between the semiconductor portion and the counter electrode.

8. A detecting device, comprising:
a detecting device including
a substrate,
a pixel electrode formed of a transparent conductive oxide,
an impurity semiconductor portion, and
a semiconductor portion,
wherein the pixel electrode, impurity semiconductor portion, and semiconductor portion are formed upon the substrate in that order from the substrate side;
wherein the impurity semiconductor portion includes
a first impurity semiconductor layer including a place in contact with the pixel electrode, and
a second impurity semiconductor layer situated nearer to the semiconductor portion than the first impurity semiconductor layer;
and wherein a concentration of a dopant in the second impurity semiconductor layer is higher than a concentration of a dopant in the first impurity semiconductor layer.

9. The detecting device according to claim 8, further comprising:
a switching device disposed between the substrate and the pixel electrode; and
an inter-layer insulating layer interposed between the substrate and switching device, and the pixel electrode;
wherein a contact hole for electrical connection between the pixel electrode and the switching device is formed in the inter-layer insulating layer;
and wherein the pixel electrode and the switching device are electrically connected a the contact hole.

10. The detecting device according to claim 8, further comprising:
a metal member disposed above the pixel electrode, in contact with a part of the pixel electrode and the second impurity semiconductor layer.

11. The detecting device according to claim 10,
wherein the switching device is a thin-film transistor having a control electrode, first main electrode, and second main electrode, the control electrode being electrically connected to a control line and the first main electrode connected to a signal line;
and wherein the metal member is disposed such that the orthogonal projection of the metal member overlays at least one of the control line, signal line, control electrode, first main electrode, and second main electrode.

12. The detecting device according to claim 9, further comprising:
a covering member disposed so as to cover the surface of the inter-layer insulating layer and the pixel electrode.

13. The detecting device according to claim 8,
wherein the semiconductor portion is formed of amorphous silicon, and the impurity semiconductor portion is formed of n-type amorphous silicon;
and wherein the concentration of dopant in the first impurity semiconductor layer is less than $1.0 \times 10^{21}$, and the concentration of dopant in the second impurity semiconductor layer is $1.0 \times 10^{21}$ or greater.

14. The detecting device according to claim 13,
wherein the conversion device includes
a counter electrode disposed facing the pixel electrode, and
another impurity semiconductor portion formed of p-type amorphous silicon, between the semiconductor portion and the counter electrode.

15. The detecting device according to claim 1, further comprising:
a light source provided on the substrate, on the side of the substrate opposite to the side where the conversion device is disposed.

16. A detecting system comprising:
the detecting device according to claim 1;
a radiation source configured to emit radiation toward the detecting device;
a signal processing unit configured to process signals from the detecting device;
a recording unit configured to record signals from the signal processing unit;
a display unit configured to display signals from the signal processing unit; and
a transmission processing unit configured to transmit signals from the signal processing unit.

* * * * *